(12) United States Patent
Raeder

(10) Patent No.: US 6,444,564 B1
(45) Date of Patent: Sep. 3, 2002

(54) METHOD AND PRODUCT FOR IMPROVED USE OF LOW K DIELECTRIC MATERIAL AMONG INTEGRATED CIRCUIT INTERCONNECT STRUCTURES

(75) Inventor: Christopher H. Raeder, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/198,121

(22) Filed: Nov. 23, 1998

(51) Int. Cl.⁷ .......................................... H01L 21/4763
(52) U.S. Cl. ................... 438/618; 438/624; 438/635; 438/634
(58) Field of Search ............................ 438/622, 623, 438/624, 633, 631, 634, 692, 626, 618

(56) References Cited

U.S. PATENT DOCUMENTS

| | | |
|---|---|---|
| 4,101,707 A | 7/1978 | Henry |
| 4,430,152 A | 2/1984 | Okano |
| 4,683,024 A | 7/1987 | Miller et al. |
| 4,863,561 A | 9/1989 | Freeman et al. |
| 4,889,832 A | 12/1989 | Chatterjee |
| 4,944,836 A | 7/1990 | Beyer et al. |
| 5,064,683 A | 11/1991 | Poon et al. |
| 5,192,626 A | 3/1993 | Sekiya et al. |
| 5,260,096 A | 11/1993 | Holzl et al. |
| 5,269,879 A | 12/1993 | Rhoades et al. |
| 5,284,548 A | 2/1994 | Carey et al. |
| 5,296,742 A | 3/1994 | Sakai |
| 5,317,192 A | 5/1994 | Chen et al. |
| 5,319,246 A | 6/1994 | Nagamine et al. |
| 5,334,552 A | 8/1994 | Homma |
| 5,352,913 A | 10/1994 | Chung et al. |
| 5,365,095 A | 11/1994 | Shono et al. |
| 5,429,995 A | 7/1995 | Nishiyama et al. |
| 5,436,188 A | 7/1995 | Chen |

(List continued on next page.)

FOREIGN PATENT DOCUMENTS

| | | |
|---|---|---|
| EP | 0 706 216 | 4/1996 |
| JP | 2-161755 | 6/1990 |

OTHER PUBLICATIONS

Japanese Patent Abstract, Pub. No. 05–243226, Published Sep. 21, 1993.
Japanese Patent Abstract, Pub. No. 03–157659, Published Jul. 5, 1991.
Japanese Patent Abstract, Pub. No. 06–132252, Published May 13, 1994.
Japanese Patent Abstract, Pub. No. 03–296217, Published Dec. 26, 1991.
Yoshimaru et al., "Reduction of Wiring Capacitance with New Low Dielectric SiOF Interlayer Film for High Speed/Low Power Sub–half Micron CMOS," 1994 Symposium on VLSI Technology Digest of Technical Papers, Pub. Date Jul. 6, 1994, pp. 59–60.
Wolf, Silicon Processing for the VLSI Era, Vol. 2: Process Integration, Lattice Press 1990, pp. 233–236.

*Primary Examiner*—Caridad Everhart
(74) *Attorney, Agent, or Firm*—Kevin L. Daffer; Conley, Rose & Tayon P.C.

(57) ABSTRACT

A method is presented for forming a liner upon spaced interconnect structures arranged upon a semiconductor topography. An oxide layer may be deposited to form the liner. The spaced interconnect structures may each include an interlevel dielectric portion arranged upon a metal interconnect portion, with gaps defined between adjacent interconnect structures. A low k dielectric material may be deposited over the interconnect structures such that the low k material substantially fills the gaps between adjacent interconnect structures. The low k dielectric material may then be planarized, preferably by chemical mechanical polishing.

20 Claims, 5 Drawing Sheets

U.S. PATENT DOCUMENTS

| | | |
|---|---|---|
| 5,510,652 A | 4/1996 | Burke et al. |
| 5,534,731 A | 7/1996 | Cheung |
| 5,549,786 A | 8/1996 | Jones et al. |
| 5,552,628 A | 9/1996 | Watanabe et al. |
| 5,589,416 A * | 12/1996 | Chittipeddi |
| 5,604,380 A | 2/1997 | Nishimura et al. |
| 5,625,232 A | 4/1997 | Numata et al. |
| 5,661,344 A | 8/1997 | Havemann et al. |
| 5,676,587 A | 10/1997 | Landers et al. |
| 5,759,906 A | 6/1998 | Lou |
| 5,814,558 A * | 9/1998 | Jeng et al. .................. 438/623 |
| 5,858,870 A * | 1/1999 | Zheng et al. ............... 438/622 |
| 5,948,700 A * | 9/1999 | Zheng et al. ............... 438/694 |
| 6,130,154 A * | 10/2000 | Yokoyama et al. |

\* cited by examiner

METHOD AND PRODUCT FOR IMPROVED USE OF LOW K DIELECTRIC MATERIAL AMONG INTEGRATED CIRCUIT INTERCONNECT STRUCTURES

BACKGROUND OF THE INVENTION

1. Field of the Invention

This invention relates to semiconductor processing and, more particularly, to a method for forming interconnect lines with improved use of low k dielectric material in the intermetal dielectric material electrically separating such interconnect lines.

2. Description of the Related Art

An integrated circuit includes numerous active devices arranged on a single substrate. In order to implement desired functions, select components of a circuit must be interconnected. Interconnects, or thin lines of conductive material, are used to form electrical connections between active devices. In the desire to build more complex integrated circuits, the active device density within a given chip has greatly increased. Because of space limitations caused in large part by the increase in active device density, multiple levels of interconnect must often be used. Within each level of interconnect, interconnect lines are insulated from underlying levels, overlying levels, and each other by dielectric materials.

The performance of an integrated circuit is limited by its propagation delay, notably known as the time required for a signal to travel from one point within the circuit to another. As the feature size decreases, the need to reduce the resistance and capacitance, and thus the RC delay, associated with interconnection paths becomes more urgent. For example, in submicron metal oxide semiconductor field-effect transistors (MOSFETs) the interconnect RC delay can exceed delays due to gate switching. In order to continue to improve integrated circuit performance, these RC delays must be decreased.

There are numerous factors that effect the RC delay of interconnect lines. One of these factors is the resistance, R, of the interconnect lines, which may be defined as:

$$R = (\rho L)/W_L T_C$$

where $\rho$ represents resistivity of the conductive material, L is the interconnect length, $W_L$ is the interconnect width, and $T_C$ is the interconnect thickness. Obviously, if low resistivity materials are used as interconnect, signals will be able to propagate through the circuit faster. Consequently, metals such as aluminum and copper are often used to form interconnect lines. Although increasing the width and thickness of interconnect lines will also help to decrease the resistivity of such lines, increases in line dimensions are limited by the available space and the fact that the capacitance between lines increases as the spacing between lines decreases.

Interconnect RC delay is also affected by the parasitic capacitances between laterally spaced conductors (i.e., intralevel capacitance) and between vertically spaced conductors or between a conductor and the underlying substrate (i.e., interlevel capacitance). Increases in active device density may cause the dielectric spacing between levels of interconnect and within levels of interconnect to decrease. As the dielectric spacing between levels of interconnect decreases, the interlevel capacitance must conversely increase. Likewise, as the dielectric spacing within a level of interconnect decreases, the intralevel capacitance increases. Unfortunately, increases in these parasitic capacitances may result in lengthening of the propagation delay.

Interlevel and intralevel capacitances may be reduced, however, by reducing the permittivity, $\in$, of the intermetal dielectric material used to separate conductors. By normalizing the permittivity, $\in$, of a material to the permittivity of vacuum, $\in_o$, the relative permittivity of a material can be determined. Relative permittivity, or dielectric constant, k, is typically used in place of permittivity. The dielectric constant of a material is defined as:

$$k = \in / \in_o$$

The k value of the dielectric material used to insulate interconnect lines has a strong effect on the intermetal capacitance, C, which may be defined as follows:

$$C = k \in_o W_L T_C / T_d$$

where $T_d$ is the thickness of the dielectric material between adjacent interconnect lines. Not only will low k dielectric materials (i.e., those materials that have k values less than about 3.5) reduce intermetal parasitic capacitances, but many, such as low k spin-on glasses ("SOGs") may be used to fill narrower spaces without causing voids often encountered in conventional chemical vapor deposited ("CVD") films. Common SOG materials include silicates or siloxanes mixed in alcohol-based solvents.

Because of the aforementioned properties, SOGs are often used as intermetal dielectrics. A conventional process that incorporates SOG in this manner is the etchback SOG process. One unfortunate characteristic of SOGs (and many other low k dielectric materials) is that they have a low density, and thus tend to absorb moisture easily. If contacts are formed through SOG, moisture from the SOG may migrate into the vias, potentially causing the undesirable "poisoned via" effect. An advantage of the etchback SOG process is that SOG is removed from raised areas where contacts may be formed.

In this process, a first interlevel dielectric film is CVD deposited over a set of patterned metal interconnect and serves as a liner between the metal and any dielectric material deposited in the gaps between adjacent interconnect. This film, usually a CVD silicon oxide ("oxide"), will generally conform to the interconnect topography. As a result, the spaces between adjacent interconnect will be more narrow than before the interlevel dielectric was deposited. A SOG film is then spun on, and fills the remainder of the gap between the interconnects. Portions of the SOG layer and the uppermost layer of the first CVD dielectric layer are then removed, typically using a dry plasma etch process. In this manner, SOG material is removed in areas where vias will be etched and contacts formed, but remains in the gaps between interconnect. A second oxide interlevel dielectric film is then deposited.

One problem of the etchback SOG process is that the first interlevel dielectric must be deposited at a thickness sufficient to prevent the underlying metal interconnects from being exposed during the etchback step. Because this film is deposited at this thickness over the entire interconnect topography, the amount of space available between adjacent interconnect for low k dielectric material may be reduced. If the interlevel dielectric layer becomes too thick, the spacing may even be reduced to the point where SOG cannot sufficiently flow between the coated interconnect. As the spacing between adjacent interconnects grows smaller, this "pinching off" effect only increases.

In addition, there is typically a substantial difference in the etch rate between the SOG in the gap fill and the oxide in the interlevel dielectric layer. As a result, the topography defined by the interlevel dielectric film and the SOG gap fill may not be sufficiently planar. An insufficient degree of non-planarization can hinder the reliable manufacture of overlying interconnects. The need for an increased degree of planarization becomes even greater as the interconnect pitch (i.e., the sum of the interconnect line width and the space between the adjacent interconnect lines) decreases. Furthermore, the etch chemistry of many low dielectric constant materials closely resembles that of photoresist, which makes them very difficult to etch. Consequently, it is troublesome to incorporate such materials into process flows that incorporate etchback techniques in a manner similar to the SOG etchback process.

Therefore, it would be desirable to develop a technique for fabricating interconnect in which the amount of low k dielectric material utilized could be increased. It would also be advantageous to increase the degree of planarization of the intermetal dielectric topography. The improved process would allow the use of difficult-to-etch, low k value dielectric materials.

SUMMARY OF THE INVENTION

The problems identified above are in large part solved by the method presented herein for forming interconnect lines with improved use of low k dielectric material in the intermetal dielectric material insulating such interconnect lines. In this method, a metal layer and a dielectric layer arranged upon the metal layer may both be patterned to form interconnect structures that each include an interlevel dielectric portion and metal interconnect portion. A liner may then be deposited upon the interconnect structures and the semiconductor substrate. The interconnect structures are spaced by gaps, which may then be filled by a low k dielectric material. The low k dielectric material may then be planarized.

Unlike the SOG etchback process, the present method allows for formation of interlevel dielectric portions exclusively above the metal interconnect portions of the interconnect structures. Since the interlevel dielectric portions may be contained above the metal interconnect portions, the desire to form a thick layer of a dielectric material (e.g., oxide) directly above the metal interconnects does not reduce the space available between adjacent interconnect structures for low k dielectric material. Consequently, the liner, which is formed over the interconnect structures, does not need to function to prevent erosion of the metal interconnect portions during planarization. The liner, therefore, may be deposited thinner than the interlevel dielectric layer of the SOG etchback process. The thinner liner creates more space between the interconnect structures, and allows a greater quantity of low k dielectric material to utilized therebetween.

Furthermore, any contacts made to the metal interconnect portions of the interconnect structures are preferably made through the interconnect structures' interlevel dielectric portions and not through the low k dielectric material disposed between the interconnect structures. Thus, low k materials may be used that, because of their difficulty of etching, would not be available if it was necessary to etch a via in the low k dielectric material to form the contact. It should also be noted that formation of the liner is not strictly necessary. If the low k dielectric material is compatible with the metal interconnect portions and the critical dimensions of any contacts made to the metal interconnect portions are narrow, then the liner may not be necessary. Additionally, if the metal used for the contacts is compatible with the low k dielectric material, then the liner again may not be needed.

Planarization of the low k dielectric material is preferably undertaken by chemical-mechanical polishing ("CMP"). The use of polishing techniques instead of etchback techniques to planarize the low k material may allow the use of difficult-to-etch materials, such as many low dielectric constant polymers. In addition, polish stop portions arranged above the interlevel dielectric portions of the interconnect structures may be used to increase polish uniformity. Use of the present method preferably results in an interconnect level that exhibits a high degree of planarization.

According to one embodiment, a liner is formed upon spaced interconnect structures arranged upon a semiconductor topography. An oxide layer may be deposited to form the liner. The spaced interconnect structures may each include an interlevel dielectric portion arranged upon a metal interconnect portion, with gaps defined between adjacent interconnect structures. A low k dielectric material may be deposited over the interconnect structures such that the low k material substantially fills the gaps between adjacent interconnect structures. The low k dielectric material may then be planarized, preferably by chemical-mechanical polishing. Planarization of the low k dielectric material is preferably discontinued before a substantial amount of the interlevel dielectric portions of the interconnect structures is removed.

In addition, a polish stop portion may be arranged upon the interlevel dielectric portion of each interconnect structure. The polish stop portion is preferably composed of silicon nitride. Polishing of the low k material is discontinued at a point in time subsequent to the initiation of polishing of the polish stop portions. Because the polish stop portions are preferably highly resistant to abrasive removal, polishing of the low k material may be extended for a time sufficient to produce a high degree of planarization. After polishing is completed, the polish stop portions may be removed using, e.g., etchback.

Alternately, the liner may be composed of a material (e.g., silicon nitride) that is configured to serve as a polish stop. Because many of the materials used as polish stops have relatively high k values, the overall k value of the aggregate intermetal dielectric (i.e., the composite of the dielectric constants of the low k gap fills, the liner, and the interlevel dielectric portions) may increase. However, using the liner as a polish stop allows the benefits of increased planarity without adding additional process steps, which may make this process flow a viable alternative.

According to another embodiment, a layer of metal is first formed upon a semiconductor topography. A layer of dielectric material may be formed upon the layer of metal. These layers may be patterned to form spaced interconnect structures, with gaps defined between adjacent interconnect structures. Each interconnect structure preferably includes an interlevel dielectric portion arranged upon a metal interconnect portion. In patterning the layer of dielectric material, resist may be spun on, exposed, and developed as is well known in the art to provide the patterned masking layer used to define the interconnect structures during subsequent etching steps. As an alternate process flow, the masking layer may be removed after etching the layer of dielectric material, and the patterned interlevel dielectric layer may be used as a hard mask for etching the metal. In addition, a polish stop layer may be formed above the layer of dielectric material. After etching of the polish stop layer and the layer of dielectric material, the masking layer used to define the pattern for these may be removed. Then, the patterned polish stop layer and the patterned interlevel dielectric layer may be used as a hard mask.

A liner may be subsequently formed upon the semiconductor topography, preferably by deposition of silicon dioxide. A low k dielectric material may then be deposited over the interconnect structures such that the low k dielectric material substantially fills the gaps between adjacent interconnect structures. The low k dielectric material may be any of a variety of dielectric materials having a k value of less than about 3.5. These materials may include fluorine-doped silicon oxide, spin-on glasses, and polymers. The manner of deposition is, of course, dependent on the material to be deposited. For example, the low k dielectric material can be spun-on or deposited using a plasma or non-plasma source. After deposition, the low k dielectric material may then be planarized.

In another embodiment, an integrated circuit is presented that includes a plurality of spaced interconnect structures arranged above a semiconductor topography. The interconnect structures may each include an interlevel dielectric portion arranged upon a metal interconnect portion. A liner may be formed upon the plurality of interconnect structures and the semiconductor topography. A low k dielectric material substantially fills the gaps between adjacent interconnect structures. In addition, each of the interconnect structures may also include a polish stop portion arranged upon its interlevel dielectric portion. Alternately, the liner may be configured to serve as a polish stop.

BRIEF DESCRIPTION OF THE DRAWINGS

Other objects and advantages of the invention will become apparent upon reading the following detailed description and upon reference to the accompanying drawings in which.

Figure 1:
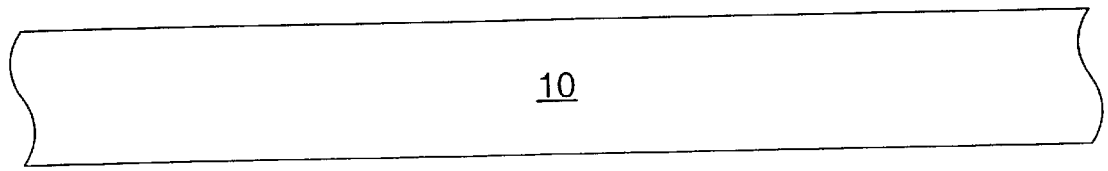
FIG. 1 is a partial cross-sectional view of a semiconductor topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to the drawings, FIG. 1 presents semiconductor topography 10. Semiconductor topography 10 may include an interlevel dielectric layer that overlies active areas formed upon a semiconductor substrate. The active areas may include a variety of semiconductor devices. Semiconductor topography 10 may also have contacts and interconnect lines formed within (not shown in FIG. 1).

Figure 2:
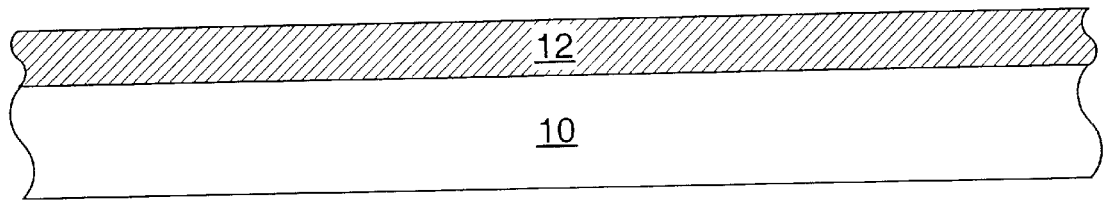
FIG. 2 is a partial cross-sectional view of the semiconductor topography, wherein a layer of metal is formed upon the semiconductor topography according to an initial processing step.

FIG. 2 depicts a processing step in which metal layer 12 is formed above semiconductor topography 10. Metal layer 12 is preferably composed of a low resistance metal. Suitable materials for metal layer 12 include aluminum or an alloy of aluminum and other elements such as copper, titanium, silicon, or palladium. Metal layer 12 may be deposited by, for example, sputter deposition of the desired metal composition.

Figure 3:
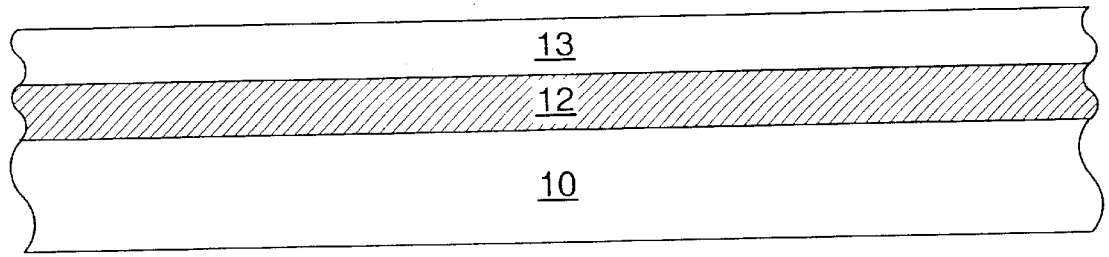
FIG. 3 is a partial cross-sectional view of the semiconductor topography, wherein a layer of dielectric material is formed upon the semiconductor topography according to a processing step subsequent to FIG. 2.

FIG. 3 shows a processing step in which dielectric layer 13 is formed upon metal layer 12. Contacts to underlying metal interconnect lines may be made through portions of dielectric layer 13 in subsequent processing steps. Consequently, dielectric layer 13 is preferably composed of a dielectric material which does not have any substantial compatibility problems with the metals commonly used in the formation of contacts. Suitable materials for dielectric layer 13 include oxide, which may be doped with fluorine to decrease its dielectric constant. Dielectric layer may be deposited by, for example, decomposition of tetraethyl orthosilicate (TEOS) in a plasma enhanced CVD process.

Figure 4:
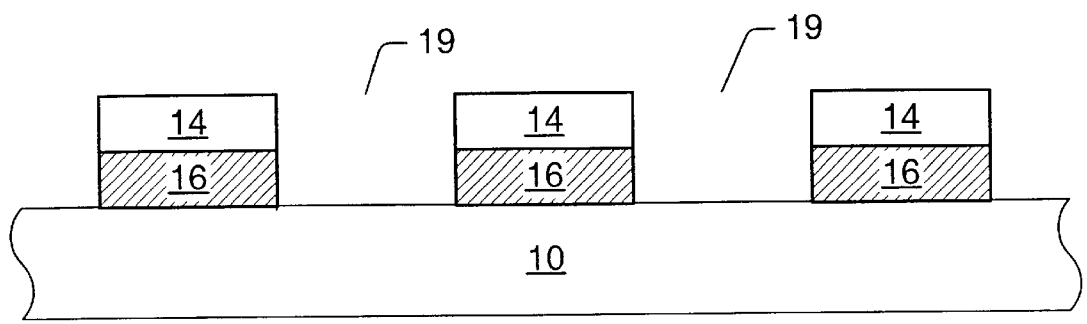
FIG. 4 is a partial cross-sectional view of the semiconductor topography, wherein the layer of dielectric material and the layer of metal are patterned to form spaced interconnect structures according to a processing step subsequent to FIG. 3.

As illustrated in FIG. 4, dielectric layer 13 and metal layer 12 may be patterned to form spaced interconnect structures. Portions of semiconductor topography 10 may be exposed as a result of the patterning. Gaps 19 may be defined between adjacent interconnect structures. These interconnect structures each preferably include an interlevel dielectric portion 14 arranged upon a metal interconnect portion 16. It should be understood that the spacing between each interconnect structure is not necessarily uniform. On the contrary, the widths of gaps 19 may vary considerably, with some interconnects being spaced closely and others farther apart. In addition, the widths of individual interconnect structures may also vary.

In patterning dielectric layer 13 and metal layer 12, resist may be spun on, exposed, and developed as is well known in the art to provide the patterned masking layer (not shown) used to define the interconnect structures during subsequent etching steps. A variety of techniques may be used to etch dielectric layer 13 and metal layer 12. For example, a two-stage dry etch process may be used in which dielectric layer 13 is first etched using $CF_4$ (or another fluorocarbon), and then metal layer 12 is etched using a chlorine-containing compound such as $BCl_3$, $CCl_4$, $SiCl_4$, or $Cl_2$. As an alternate process flow, the masking layer may be removed after patterning of dielectric layer 13 but before patterning of metal layer 12. Then, the patterned portions of dielectric layer 13 (interlevel dielectric portions 14 in FIG. 4) may be used as a hard mask for the patterning of metal layer 12 to form metal interconnect portions 16. In this case, it may be necessary to deposit dielectric layer 13 at a thickness greater than what is necessary for insulation purposes to account for erosion of interlevel dielectric portions 14 during the etching process.

Figure 5:
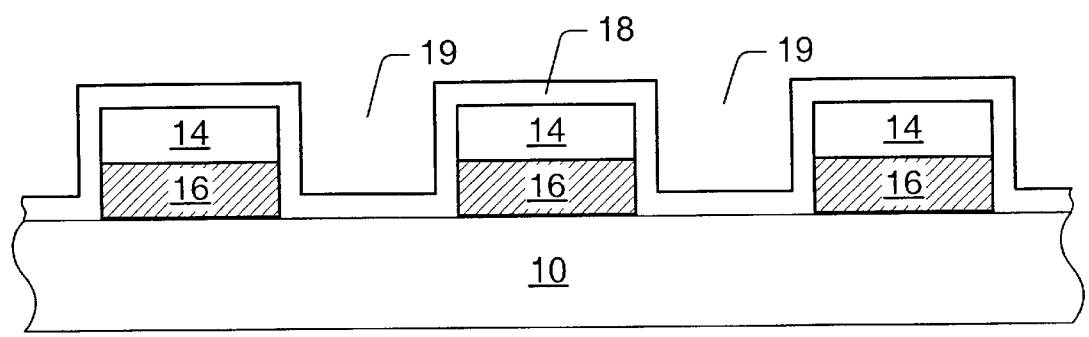
FIG. 5 is a partial cross-sectional view of the semiconductor topography, wherein a liner is formed upon the spaced interconnect structures and the semiconductor topography according to a processing step subsequent to FIG. 4.

FIG. 5 depicts the deposition of liner 18 over the interconnect structures and semiconductor topography 10. Liner 18 may be composed of oxide deposited by the decomposition of TEOS in a plasma enhanced CVD process. Liner 18 preferably serves to improve adhesion between metal interconnect portions 16 and any dielectric material deposited in gaps 19. Moreover, liner 18 may provide a barrier to moisture migration from any subsequently deposited low k dielectric material.

Figure 6:
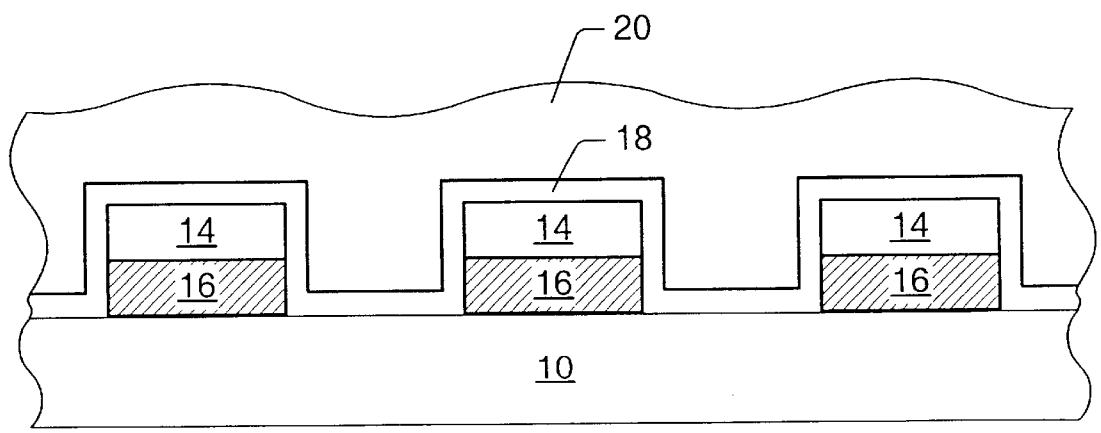
FIG. 6 is a partial cross-sectional view of the semiconductor topography, wherein a low k dielectric material is deposited over the spaced interconnect structures such that the material substantially fills the gaps between adjacent interconnect structures according to a processing step subsequent to FIG. 5.

As shown in FIG. 6, low k dielectric material 20 may deposited such that it substantially fills gaps 19 between adjacent interconnect structures. Low k dielectric material 20 may be composed of a variety of low k value materials (i.e., those having a k value less than about 3.5), including: fluorine-doped silicon oxide (FSG), low k SOGs (e.g., hydrogen silsesquioxane and methyl silsesquioxane), polymers (e.g., polyimide and parylene), and porous gels or foams. Some of these materials, such as FSG, may be deposited by CVD methods, while others, such as SOGs and polymers, are typically spun on. Outgassing is a problem with many low k dielectric materials, especially with those low k dielectric materials that are spun on. To help mitigate any outgassing effects, low k dielectric material 20 may be spun on in multiple layers. A baking step may follow the deposition of each layer. Depositing low k dielectric material 20 in such a manner may also aid in increasing the degree of planarization of low k dielectric material 20 after deposition.

Figure 7:
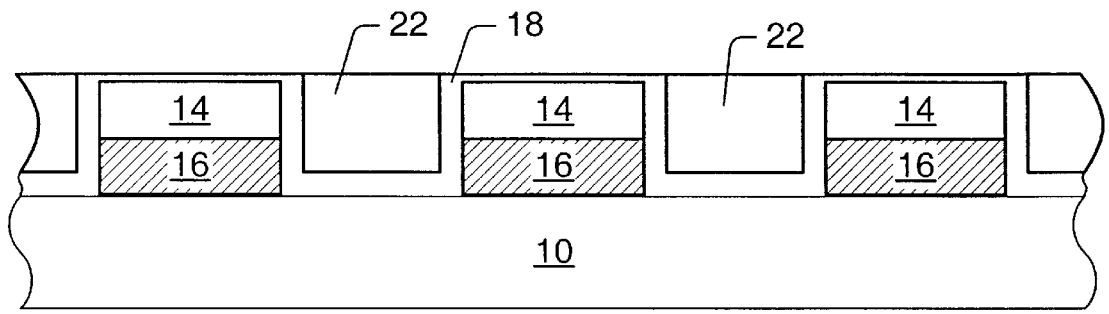
FIG. 7 is a partial cross-sectional view of the semiconductor topography, wherein the low k dielectric material is planarized according to a processing step subsequent to FIG. 6.

FIG. 7 depicts a processing step in which the low k dielectric material is planarized such that it is contained between adjacent interconnect structures (shown as low k gap fills 22 in FIG. 7). Planarization of low k dielectric material 20 is preferably carried out such that substantially all low k dielectric material 20 is removed from directly above the interconnect structures. Consequently, contacts made to metal interconnect portions 16 in subsequent steps will not need to be made through any low k dielectric material.

If low k dielectric material 20 may be etched without a large degree of difficulty and at a rate substantially similar to the etch rates of the materials of which liner 18 and/or interlevel dielectric portions 14 are composed, then an etchback process may be used to planarize low k dielectric material 20. Preferably, however, planarization of low k dielectric material 20 to form low k gap fills 22 is undertaken by CMP. Polishing may be timed to discontinue before a substantial amount of liner 18 is polished, after polishing of a substantial amount of liner 18 but before its complete removal (as shown in FIG. 7), or after liner 18 is completely removed from above the interconnect structures. In the last case, interlevel dielectric portions 14 may need to be formed thicker than is strictly necessary for insulation purposes to account for loss of material from interlevel dielectric portions 14 during polishing. Although polishing may often result in a higher degree of planarization than similar etchback techniques, differences in the polish rates of liner 18 and low k dielectric material 20 may prevent a completely planar surface from being formed. To increase polish uniformity, the composition and pH of the slurry solution used during polishing may be adjusted in accordance with the materials used for liner 18 and low k gap fills 22.

Figure 8:
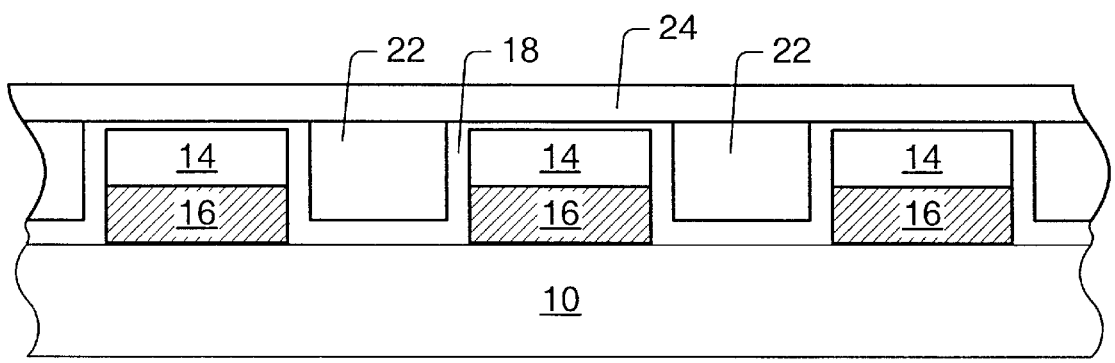
FIG. 8 is a partial cross-sectional view of the semiconductor topography, wherein a substantially planar dielectric cap is formed according to a processing step subsequent to FIG. 7.

FIG. 8 depicts the formation of dielectric cap 24 above the interconnect structures. Dielectric cap 24 is preferably composed of oxide and may be deposited from a TEOS source in a plasma enhanced CVD process. After deposition, dielectric cap 24 may be polished such that it is substantially planar. Dielectric cap 24 serves, in part, to isolate low k gap fills 22 from overlying metallization levels. If there are no substantial compatibility problems between low k gap fills 22 and the overlying levels, then dielectric cap 24 may not be necessary.

FIGS. 9–15 present a modification of the process flow depicted in FIGS. 3–8. The modification includes the use of a polish stop layer. Since the steps shown in FIGS. 9–15 are very similar to those of FIGS. 3–8, the explanation of these steps will primarily focus on the differences in the process flow caused by the inclusion of a polish stop layer.

Figure 9:
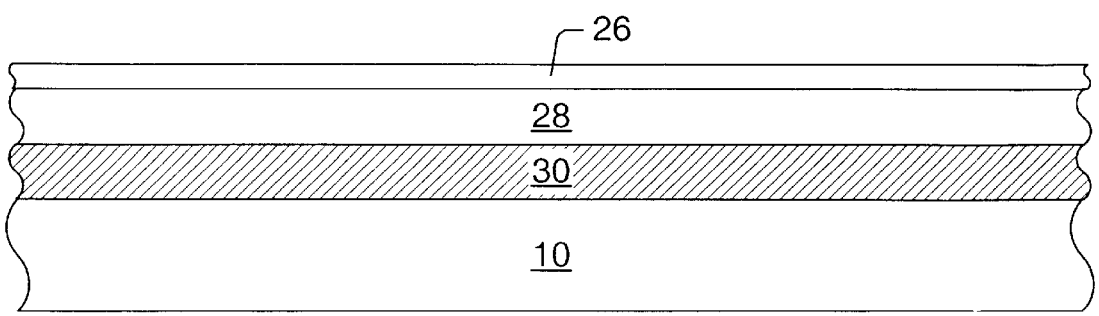
FIGS. 9–15 present a modification of the process flow shown in FIGS. 3–8, wherein a polish stop layer is implemented.

FIG. 9 depicts the formation of polish stop layer 26 above dielectric layer 28 (formed in a manner similar to dielectric layer 13) and metal layer 30 (formed in a manner similar to metal layer 12). Polish stop layer 26 is preferably composed of silicon nitride, but may be composed of any of a variety of materials commonly used as polish stops. CVD methods may be used to deposit a nitride layer that may serve as polish stop layer 26.

Figure 10:
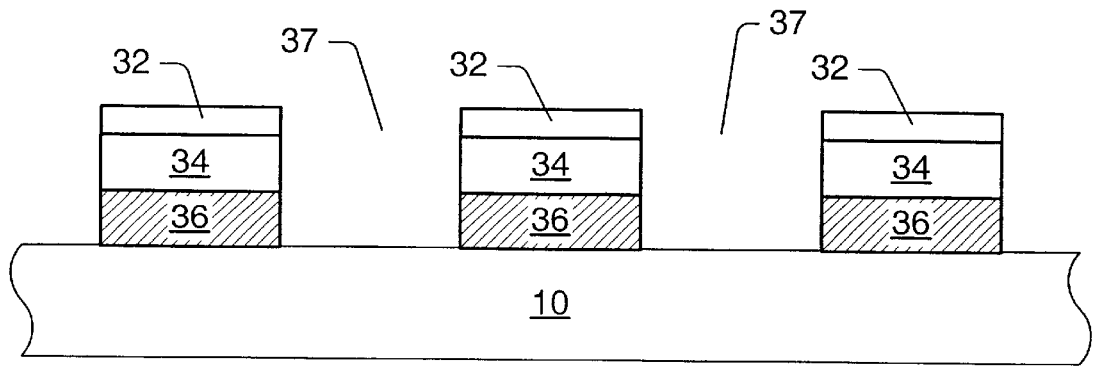

As illustrated in FIG. 10, interconnect structures may then be patterned from polish stop layer 26, dielectric layer 28, and metal layer 30. Portions of semiconductor topography 10 may be exposed as a result of patterning. Gaps 37 may be defined between adjacent interconnect structures. The interconnect structures formed by such patterning each preferably include a polish stop portion 32, an interlevel dielectric portion 34, and a metal interconnect portion 36. Interlevel dielectric portions 34 and metal interconnect portions 36 may be patterned in a manner similar to interlevel dielectric portions 14 and metal interconnect portions 16 (described above). Polish stop layer 26 may be etched in a variety of manners well known to those skilled in the art to form polish stop portions 32. For example, if polish stop layer 26 is composed of nitride, then a dry etch process that incorporates an $NF_3$ plasma may be used. In addition, the masking layer used to define the pattern for polish stop portions 32 and interlevel dielectric portions 34 may be removed after patterning of dielectric layer 28 is completed. Then, polish stop portions 32 and interlevel dielectric portions 34 may be used as a hard mask for the patterning of metal layer 30 to form metal interconnect portions 36.

Figure 11:
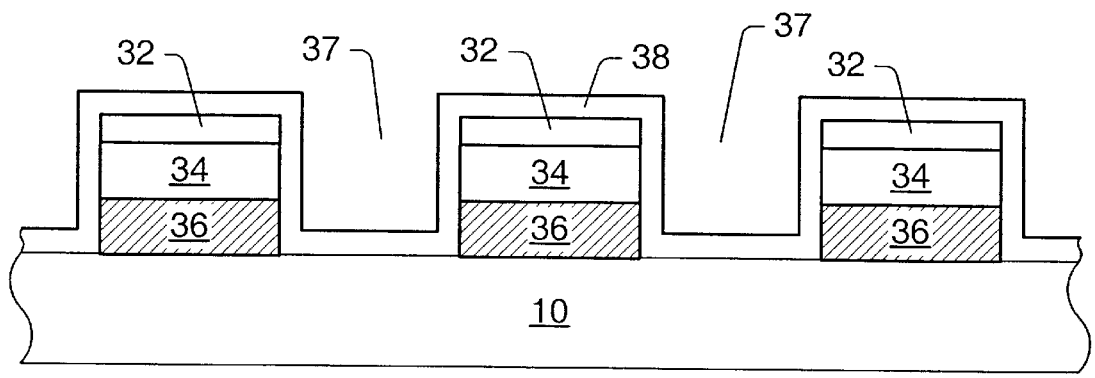

FIG. 11 depicts the deposition of liner 38 over the interconnect structures and the semiconductor topography 10. Liner 38 may be composed of oxide deposited by the decomposition of TEOS in a plasma enhanced CVD process, and may function similarly to liner 18 (described above). Alternately, liner 38 may be composed of a material suitable to be used as a polish stop, and thus polish stop portions 32 may not be required. Unfortunately, many polish stop materials (e.g., silicon nitride) have relatively high dielectric constants. Since the dielectric constant of the intermetal dielectric produced by this process will be a composite of the dielectric constants of all dielectric materials used, it will be generally desirable to reduce the k values of these materials as much as possible. Forming liner 38 out of a relatively high k dielectric material such as silicon nitride may undesirably increase the overall k value of the intermetal dielectric. Use of such material in the liner, however, allows the incorporation of a polish stop without increasing the number of processing steps, which may make this process flow a viable alternative.

Figure 12:
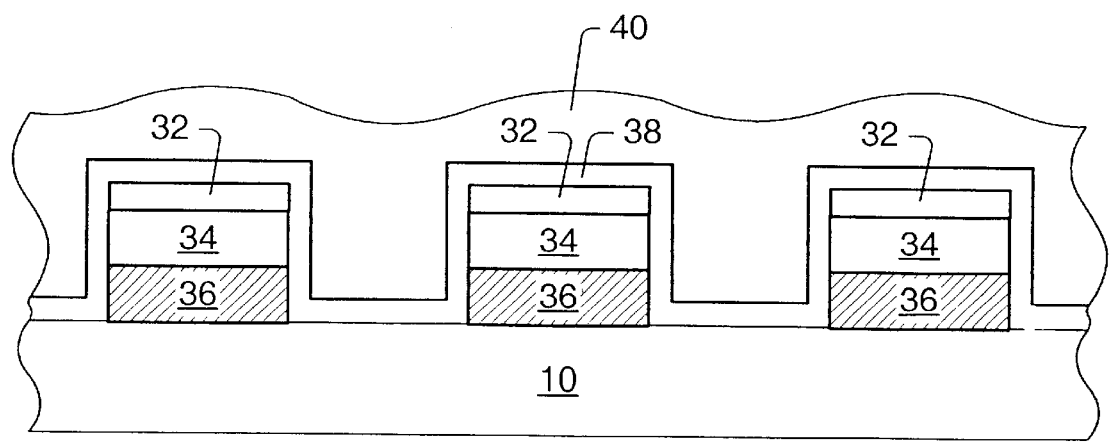

As shown in FIG. 12, low k dielectric material 40 may deposited such that it substantially fills gaps 37 between adjacent interconnect structures. Low k dielectric material 40 may be composed of materials similar to low k dielectric material 20 (described above), and may be deposited in a like manner.

Figure 13:
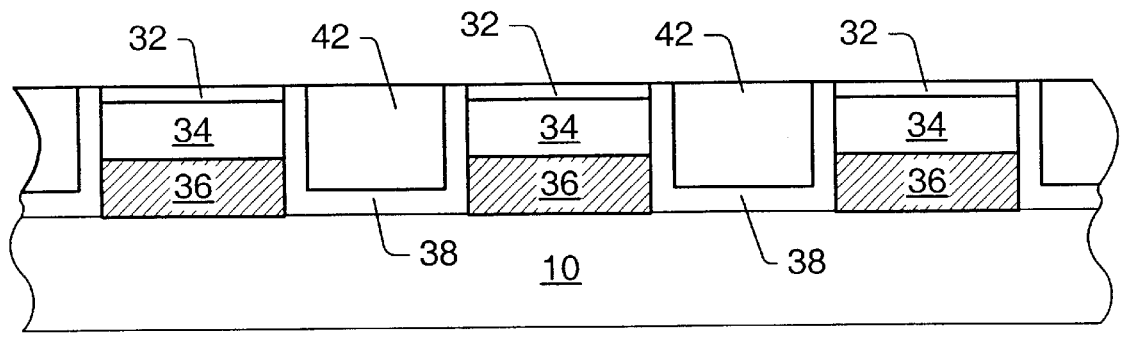

FIG. 13 depicts a processing step in which low k dielectric material 40 is planarized such that it is contained between adjacent interconnect structures (shown as low k gap fills 42). Planarization of low k dielectric material 40 is preferably carried out such that low k dielectric material 40 is removed from directly above the interconnect structures. Consequently, contacts made to the metal interconnect structures in subsequent steps will not need to be made through any low k dielectric material. Planarization of low k dielectric material 40 is preferably undertaken by CMP methods. Although polishing may be used to increase the degree of planarization over etchback techniques, differences in the polish rates of certain materials may nevertheless reduce the degree of planarization across a surface. In addition, localized variances in surface topography may have a substantial effect on the overall polishing rate. Because the CMP process used preferably removes polish stop portions 32 very slowly, the polishing time may be extended for a time sufficient to form a topography that is substantially planar with the upper surfaces of polish stop portions 32. Thus, polish stop portions 32 may be used to increase both polish uniformity and overall planarity.

Figure 14:
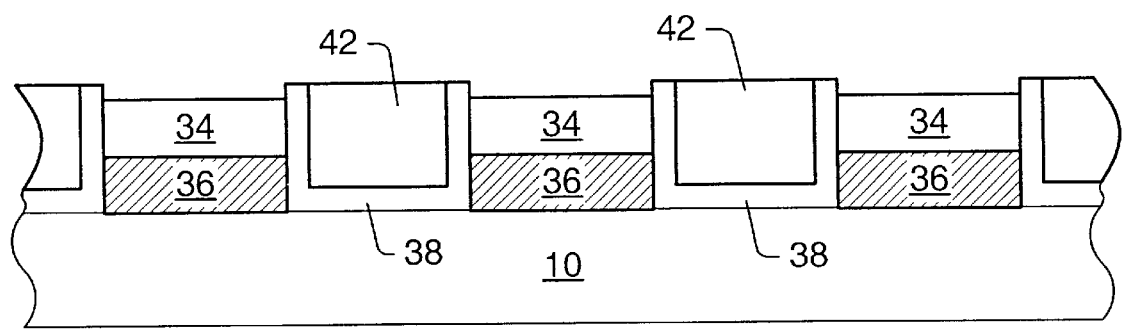

Polishing of low k dielectric material 40 may continue through all portions of liner 38 that are above polish stop portions 32. Because polish stop portions 32 may be made of relatively high k dielectric material such as nitride, polish stop portions 32 may be removed after the polishing is complete (as shown in FIG. 14.). Removal of this portions may be accomplished by the use of an etch process that is selective to the materials in liner 38, interlevel dielectric portions 34, and low k gap fills 42 over the material of which polish stop portions 32 are composed.

Figure 15:
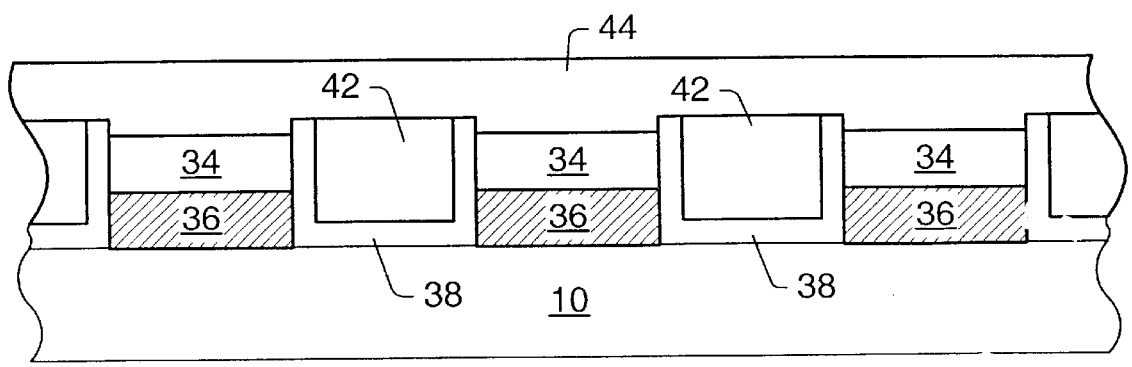

FIG. 15 illustrates the formation of dielectric cap 44 above the interconnect structures. Dielectric cap 44 preferably serves a similar purpose to dielectric cap 24 (described above), and may be formed in a like manner. As with dielectric cap 24, if there are no substantial compatibility problems between low k gap fills 42 and any overlying metallization levels, then dielectric cap 44 may not be necessary.

It will be appreciated to those skilled in the art having the benefit of this disclosure that this invention is believed to provide a method for forming interconnect lines with improved use of low k dielectric material in the intermetal dielectric material insulating such interconnect lines. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
   forming a liner upon interconnect structures, each of which comprise an interlevel dielectric portion arranged upon a metal interconnect portion, wherein gaps are defined between adjacent interconnect structures spaced across a semiconductor topography;
   depositing a low k dielectric material over the interconnect structures such that the low k dielectric material substantially fills the gaps between adjacent interconnect structures; and
   planarizing the low k dielectric material, wherein said planarizing the low k dielectric material comprises polishing the low k dielectric material such that substantially all low k dielectric material is removed from directly above the interconnect structures.

2. The method of claim 1, wherein said forming a liner comprises depositing silicon dioxide.

3. The method of claim 1, wherein the spaced interconnect structures each further comprise a polish stop portion arranged upon the interlevel dielectric portion, and wherein said polishing the low k dielectric material is discontinued at a point in time subsequent to the initiation of removing of the polish stop portions.

4. The method of claim 3, wherein the polish stop portions of the interconnect structures comprise silicon nitride.

5. The method of claim 3, further comprising removing the polish stop portions of the interconnect structures subsequent to said polishing.

6. The method of claim 1, wherein the liner is configured to serve as a polish stop, and wherein said polishing the low k dielectric material is discontinued at a point in time subsequent to the initiation of polishing of the liner.

7. The method of claim 1, wherein planarization of the low k dielectric material is discontinued before a substantial amount of the interlevel dielectric portions of the interconnect structures is removed.

8. A method for forming an integrated circuit, comprising:
   forming a layer of metal above a semiconductor topography;
   forming a layer of dielectric material upon the layer of metal;
   patterning the layer of dielectric material and the layer of metal to form spaced interconnect structures, wherein gaps are defined between adjacent interconnect structures, and wherein the interconnect structures each comprise a interlevel dielectric portion arranged upon a metal interconnect portion;
   forming a liner upon the interconnect structures and the semiconductor topography;
   depositing a low k dielectric material over the interconnect structures such that the low k dielectric material substantially fills the gaps between adjacent interconnect structures; and
   planarizing the low k dielectric material, wherein said planarizing the low k dielectric material comprises polishing the low k dielectric material such that substantially all low k dielectric material is removed from directly above the interconnect structures.

9. The method of claim 8, wherein the low k dielectric material has a k value less than about 3.5.

10. The method of claim 9, wherein said depositing a low k dielectric material comprises spinning-on a spin-on glass over the interconnect structures.

11. The method of claim 9, wherein said low k dielectric material comprises spinning-on a polymer over the interconnect structures.

12. The method of claim 9, wherein said depositing a low k dielectric material comprises depositing fluorine-doped silicon dioxide over the interconnect structures.

13. The method of claim 8, wherein said patterning comprises:
- forming a patterned masking layer above the layer of dielectric material;
- etching the layer of dielectric material such that a patterned interlevel dielectric layer is formed;
- removing the masking layer; and
- after said removing and using the patterned interlevel dielectric layer as a hard mask, etching the layer of metal.

14. The method of claim 8, wherein said patterning comprises:
- forming a patterned masking layer above a polish stop layer formed upon the layer of dielectric material;
- etching the polish stop layer such that a patterned polish stop layer is formed;
- etching the layer of dielectric material such that a patterned interlevel dielectric layer is formed;
- removing the masking layer; and
- after said removing and using the patterned polish stop layer and the patterned interlevel dielectric layer as a hard mask, etching the layer of metal.

15. The method of claim 8, further comprising forming a substantially planar dielectric cap above the low k dielectric material.

16. The method of claim 8, wherein the spaced interconnect structures each further comprise a polish stop portion arranged upon the interlevel dielectric portion, and wherein said polishing the low k dielectric material is discontinued at a point in time subsequent to the initiation of removing of the polish stop portions.

17. A method for forming an integrated circuit, comprising:
- forming a liner upon interconnect structures, each of which comprise an interlevel dielectric portion arranged upon a metal interconnect portion, wherein gaps are defined between adjacent interconnect structures spaced across a semiconductor topography;
- depositing a low k dielectric material over the interconnect structures such that the low k dielectric material substantially fills the gaps between adjacent interconnect structures; and
- planarizing the low k dielectric material, wherein said planarizing the low k dielectric material comprises polishing the low k dielectric material, wherein the spaced interconnect structures each further comprise a polish stop portion arranged upon the interlevel dielectric portion, and wherein said polishing the low k dielectric material is discontinued at a point in time subsequent to the initiation of removing of the polish stop portions.

18. A method for forming an integrated circuit, comprising:
- forming a layer of metal above a semiconductor topography;
- forming a layer of dielectric material upon the layer of metal;
- patterning the layer of dielectric material and the layer of metal to form spaced interconnect structures, wherein gaps are defined between adjacent interconnect structures, and wherein the interconnect structures each comprise a interlevel dielectric portion arranged upon a metal interconnect portion;
- subsequently forming a liner upon the interconnect structures and the semiconductor topography;
- depositing a low k dielectric material over the interconnect structures such that the low k dielectric material substantially fills the gaps between adjacent interconnect structures, wherein said depositing a low k dielectric material comprises depositing fluorine-doped silicon dioxide over the interconnect structures; and
- planarizing the low k dielectric material.

19. The method of claim 18, further comprising forming a polish stop layer upon the dielectric material prior to said patterning, wherein said planarizing the low k dielectric material is discontinued at a point in time subsequent to an initiation of removing portions of the polish stop layer.

20. The method of claim 18, wherein said metal comprises aluminum.

* * * * *